United States Patent [19]

Teshirogi

[11] 4,184,120
[45] Jan. 15, 1980

[54] MIXING CIRCUIT

[76] Inventor: Toshihiko Teshirogi, 344, Shinsaku, Takatsu Ward, Kawasaki City, Kanagawa, Japan

[21] Appl. No.: 875,617

[22] Filed: Feb. 6, 1978

Related U.S. Application Data

[63] Continuation of Ser. No. 718,454, Aug. 30, 1976, abandoned.

[30] Foreign Application Priority Data

Aug. 28, 1975 [JP] Japan .............................. 50-118483[U]

[51] Int. Cl.$^2$ ............................................ H04B 1/28
[52] U.S. Cl. .................................... 325/436; 325/439; 325/451
[58] Field of Search ............... 325/105, 153, 318, 319, 325/430, 433, 436, 438, 439, 451; 363/159, 163; 332/9 T, 16 T, 18, 31 T, 37 R; 329/101-103

[56] References Cited

U.S. PATENT DOCUMENTS

| | | | |
|---|---|---|---|
| 2,039,634 | 5/1936 | Clay | 325/436 |
| 2,567,860 | 9/1951 | Shapiro | 325/433 |
| 3,234,466 | 2/1966 | Pearson | 325/451 |
| 3,483,473 | 12/1969 | Lynk, Jr. et al. | 325/436 |
| 3,493,869 | 2/1970 | Van Dijkum | 325/451 |
| 3,493,870 | 2/1970 | Kupfer | 325/439 |

Primary Examiner—Robert L. Griffin
Assistant Examiner—Jin F. Ng
Attorney, Agent, or Firm—Oblon, Fisher, Spivak, McClelland & Maier

[57] ABSTRACT

A mixing circuit in which the input of a mixing stage connected to a first oscillator stage is coupled to a second oscillator stage through a resistor so as to apply a bias voltage and oscillation output to the input of the mixing stage.

1 Claim, 5 Drawing Figures

MIXING CIRCUIT

This is a continuation of application Ser. No. 718,454, filed Aug. 30, 1976, now abandoned.

BACKGROUND OF THE INVENTION

The present invention relates to a mixing circuit for use in a transmitter or a receiver which is of a synthesized type using transistors.

In order to obtain proper stability agaist variations of temperature and power supply voltage, a transistor amplifier stage generally has a bias applied to the base terminal through two resistors $R_B$ and $R_G$, the resistor $R_B$ being connected at one end to the power supply B and at the other end to the base terminal, and the resistor $R_G$ being connected at one end to the base terminal and at the other end to ground, as shown in FIG. 1.

A conventional mixing circuit configuration is shown in FIG. 2 by way of example. As shown, the base of the transistor 4 of a mixing stage 1 which receives the output $f_1$ of a first oscillator stage (not shown) is coupled to the emitter of the transistor 5 of a second stage 3 through a capacitor $C_c$ (2). Biasing resistors $R_B$ and $R_G$ are connected to each of transistors 4 and 5. Therefore, this configuration can be regarded as having the equivalent coupling circuit shown in FIG. 3. Thus the voltage $E_O$ applied to the base of the mixing stage 1 can be expressed by the following equation:

$$E_O = ef_2 \cdot \frac{R}{1/\omega C_c + R} \tag{1}$$

Consequently, the voltage $E_O$ approaches the value of $e(f_2)$ in the high frequency range and drops in the low frequency range since the value of $1/\omega C_c$ increases. Accordingly, the fundamental component of the waveform of $e(f_2)$ is attenuated but it harmonics are largely unaffected. This fact applies to the high frequency components created by the distortion of the waveform in the second oscillator stage 3. In other words, the coupling using the capacitor $C_c(2)$ functions, so to speak, as a high-pass filter. As a result, the conventional circuit is subject to noise interference caused by unnecessary radiated beats.

SUMMARY OF THE INVENTIONS

Therefore, it is a primary object of the present invention to provide a mixing circuit which can inhibit the occurrence of noise interference caused by unnecessary radiated beats and which can minimize the number of parts used.

According to the present invention, there is provided a mixing circuit comprising a first oscillation stage for generating an output with a specified frequency, a transistor mixing stage the base of which is connected to said first oscillation stage, and a second oscillation stage for generating an output with a specified frequency coupled to the base of said transistor mixing stage through a resistor so as to apply a bias voltage and oscillation output to said base. Therefore, the coupling between the second oscillation stage and the mixing stage is a resistance coupling, which functions as a low-pass filter in cooperation with the circuit capacity. As a result, this circuit can inhibit unnecessary higher harmonic components as well as beat disturbance and noise interference due to higher harmonic components. In addition, it can supply a proper and stabilized bias voltage by provision of the coupling resistance without other biasing resistors and thereby can minimize the number of parts required.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
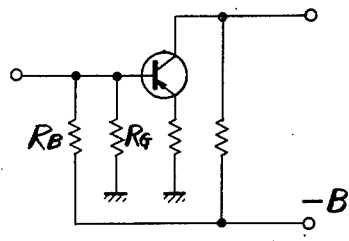
FIG. 1 is a diagram of a conventional transistor amplifier circuit.
Figure 2:
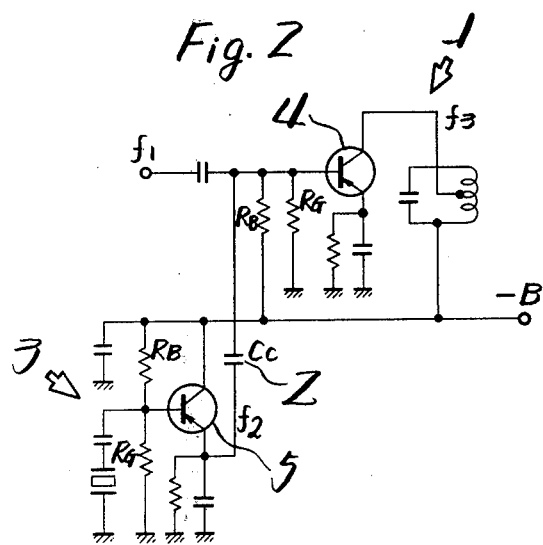
FIG. 2 is a diagram of a conventional mixing circuit.
Figure 3:
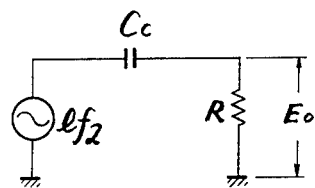
FIG. 3 is a diagram for explaining the circuit shown in FIG. 2.
Figure 4:
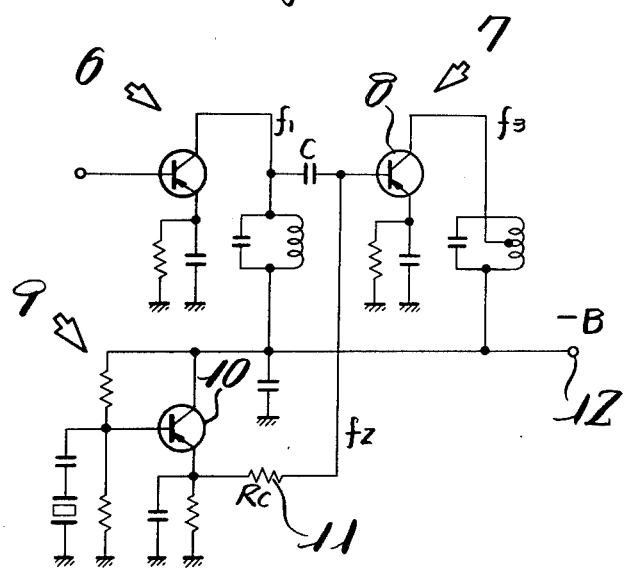
FIG. 4 is a mixing circuit diagram according to a preferred embodiment of the present invention.
Figure 5:
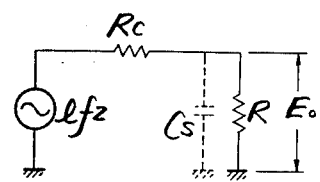
FIG. 5 is a diagram for explaining the circuits shown in FIG. 4.

Now the present invention will be described hereinafter in detail in conjunction with FIGS. 4 and 5 illustrating one embodiment of the present invention.

Reference numeral 6 designates a first oscillation stage, which generates an output with a frequency of $f_1$ and is coupled to the base of a transistor 8 of a mixing stage 7. Reference numeral 9 designate a second oscillation stage containing a transistor 10. The second oscillation stage 9 generates an output with a frequency of $f_2$. The emitter of the transistor 10 is connected to the base of the transistor 8 of the mixing stage 7 through a resistor $R_c$ (11). Reference numeral 12 designates the terminal of a power supply B.

In such a configuration, the mixed frequency $f_3$ is determined by the relationship between the frequencies $f_1$ and $f_2$. However, in addition to the fundamental wave, beats occur due to the higher harmonic components $nf_1$ and $mf_2$ where n and m are positive integers. But the coupling using the resistor $R_c$ (11) reduces at least the higher harmonic components contained in $mf_2$. More particularly, the above configuration can be regarded as having an equivalent coupling circuit shown in FIG. 5. Therefore the coupling voltage $E_O$ applied to the mixing stage can be expressed by the following equation:

$$E_O = ef_2 \cdot \frac{R // \frac{1}{\omega C_s}}{R_c + R // \frac{1}{\omega C_s}} \tag{2}$$

where $C_s$ is the circuit capacity.

Accordingly, the coupling voltage $E_O$ applied to the mixing stage 7 decreases for higher harmonic components, and therefore beat disturbance and noise interference due to higher harmonic components contained in the output $mf_2$ of the second oscillator stage 9 can be markedly reduced. Thus the coupling using the resistor $R_c$ (11) functions as a low-pass filter. In addition, the bias for the mixing stage 7 is applied through the resistor $R_c$ (11), and thereby eliminates the need for the biasing resistors $R_B$ and $R_G$ adopted in the prior art circuit.

The above-mentioned embodiment is concerned with a transmitter. It will be appreciated that the concept of the present invention can also be applied to a receiver in the same manner. In other words, the terms "a first oscillation stage" encompass a high-frequency amplifying stage, and the terms "a second oscillation stage" encompass a local oscillation stage.

It will be understood from the above description that the mixing circuit according to the present invention has a configuration in which the second oscillator stage is coupled to the base of the mixing stage through a resistor, and therefore can inhibit unnecessary higher harmonic components thereby to reduce the occurrence of beat disturbance and noise interference and the number of parts required.

Obviously, numerous modifications and variations of the present invention are possible in light of the above teachings. It is therefore to be understood that within the scope of the appended claims, the invention may be practiced otherwise than as specifically described herein.

What is claimed is:

1. A mixing circuit comprising:

a high frequency amplifier stage for generating an output with a specified frequency,
 a local oscillator stage for generating an output with a specified frequency,
 a mixing stage having an input connected to the high frequency amplifier stage, and
 a coupling path between the local oscillator stage and the input of the mixing stage comprising a resistor and functioning as a low pass filter in cooperation with stray circuit capacitances to apply a bias voltage and an oscillation output from the local oscillator stage to the input of the mixing stage to inhibit unnecessary higher harmonic components of the oscillation output of the local oscillator stage caused by waveform distortion in the local oscillator stage as well as beat disturbances and noise interference due to the higher harmonic components and to supply a stabilized bias voltage without the use of other biasing resistors.

* * * * *